United States Patent
Schwan et al.

(10) Patent No.: US 8,138,571 B2
(45) Date of Patent: Mar. 20, 2012

(54) SEMICONDUCTOR DEVICE COMPRISING ISOLATION TRENCHES INDUCING DIFFERENT TYPES OF STRAIN

(75) Inventors: Christoph Schwan, Gebhardshain (DE); Joe Bloomquist, Austin, TX (US); Peter Javorka, Dresden (DE); Manfred Horstmann, Duerroehrsdorf-Dittersbach (DE); Sven Beyer, Dresden (DE); Markus Forsberg, Dresden (DE); Frank Wirbeleit, Dresden (DE); Karla Romero, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 324 days.

(21) Appl. No.: 12/419,500

(22) Filed: Apr. 7, 2009

(65) Prior Publication Data

US 2009/0236667 A1 Sep. 24, 2009

Related U.S. Application Data

(62) Division of application No. 11/734,320, filed on Apr. 12, 2007, now Pat. No. 7,547,610.

(30) Foreign Application Priority Data

Sep. 29, 2006 (DE) .................. 10 2006 046 377

(51) Int. Cl.
*H01L 21/762* (2006.01)
(52) U.S. Cl. ............... 257/510; 257/374; 257/E21.548
(58) Field of Classification Search .................. 257/372, 257/501, 506, 374, 510, 513–515, E21.548
See application file for complete search history.

(56) References Cited

U.S. PATENT DOCUMENTS

| | | | | |
|---|---|---|---|---|
| 4,745,081 A | 5/1988 | Beyer et al. | | 438/429 |
| 5,130,268 A * | 7/1992 | Liou et al. | | 438/425 |
| 6,486,039 B2 | 11/2002 | Yoo et al. | | 438/425 |
| 6,657,276 B1 | 12/2003 | Karlsson et al. | | 257/510 |
| 2004/0032006 A1 * | 2/2004 | Yun et al. | | 257/510 |
| 2004/0063300 A1 | 4/2004 | Chi | | 438/425 |
| 2004/0113174 A1 * | 6/2004 | Chidambarrao et al. | | 257/200 |
| 2004/0212035 A1 | 10/2004 | Yeo et al. | | 257/510 |
| 2005/0260806 A1 | 11/2005 | Chang et al. | | 438/197 |
| 2006/0060925 A1 | 3/2006 | Doris et al. | | 257/369 |
| 2006/0091461 A1 | 5/2006 | Chen et al. | | 257/347 |
| 2007/0218645 A1 | 9/2007 | Zhou | | 438/427 |

FOREIGN PATENT DOCUMENTS

EP 1 304 734 A2 4/2003

OTHER PUBLICATIONS

IBM Technical Disclosure Bulletin, "Improving MOS Performance by Modulation of Stresses in Channels Using Stressed Isolation Trench Dielectric," Jan. 1998.
PCT International Search Report and Written Opinion from PCT/US2007/020598, dated Jun. 12, 2008.
Office Action dated Dec. 19, 2007 from parent U.S. Appl. No. 11/734,320.
Office Action dated May 12, 2008 from parent U.S. Appl. No. 11/734,320.

* cited by examiner

*Primary Examiner* — Marcos D. Pizarro
(74) *Attorney, Agent, or Firm* — Williams, Morgan & Amerson, P.C.

(57) ABSTRACT

By forming isolation trenches of different types of intrinsic stress on the basis of separate process sequences, the strain characteristics of adjacent active semiconductor regions may be adjusted so as to obtain overall device performance. For example, highly stressed dielectric fill material including compressive and tensile stress may be appropriately provided in the respective isolation trenches in order to correspondingly adapt the charge carrier mobility of respective channel regions.

14 Claims, 7 Drawing Sheets

SEMICONDUCTOR DEVICE COMPRISING ISOLATION TRENCHES INDUCING DIFFERENT TYPES OF STRAIN

CROSS-REFERENCE TO RELATED APPLICATION

This is a divisional of application Ser. No. 11/734,320, filed Apr. 12, 2007 now U.S. Pat. No. 7,547,610.

BACKGROUND OF THE INVENTION

1. Field of the Invention

Generally, the present disclosure relates to the manufacture of integrated circuits, and, more particularly, to the formation of transistors having strained channel regions by using strain-inducing sources, such as stressed shallow trench isolation (STI) trenches, to enhance charge carrier mobility in the channel region of a MOS transistor.

2. Description of the Related Art

Generally, a plurality of process technologies are currently practiced for manufacturing complex integrated circuits, wherein, for complex circuitry, such as microprocessors, storage chips and the like, CMOS technology is currently one of the most promising approaches, due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed near the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith, such as reduced controllability of the channel, also referred to as short channel effects, and the like, that have to be addressed so as to not unduly offset the advantages obtained by steadily decreasing the channel length of MOS transistors. The continuous size reduction of the critical dimensions, i.e., the gate length of the transistors, necessitates the adaptation and possibly the new development of highly complex process techniques. For example, to compensate for short channel effects, it has been proposed to also enhance the channel conductivity of the transistor elements by increasing the charge carrier mobility in the channel region for a given channel length. This techniques offers the potential for achieving a performance improvement that is comparable with the advance to a future technology node while avoiding or at least postponing many of the problems encountered with the process adaptations associated with device scaling.

One efficient mechanism for increasing the charge carrier mobility is the modification of the lattice structure in the channel region, for instance by creating tensile and/or compressive stress in the vicinity of the channel region so as to produce a corresponding strain in the channel region, which results in a modified mobility for electrons and holes, respectively. For example, compressive strain along the channel length direction in the channel region of a silicon layer having a standard crystallographic orientation may increase the mobility of holes, thereby providing the potential for enhancing the performance of P-type transistors. On the other hand, the creation of tensile strain along the channel length direction in the channel region of an N-channel transistor may increase electron mobility. The introduction of stress or strain engineering into the process of integrated circuit fabrication is an extremely promising approach for further device generations since, for example, strained silicon may be considered as a "new" type of semiconductor material, which may enable the fabrication of fast powerful semiconductor devices without requiring expensive semiconductor materials, while many of the well-established manufacturing techniques may still be used.

Therefore, in some approaches, the hole mobility of PMOS transistors is enhanced by forming a strained silicon/germanium layer in the drain and source regions of the transistors, wherein the compressively strained drain and source regions create strain in the adjacent silicon channel region. Similarly, carbon atoms are introduced into the silicon lattice in order to form a lattice having tensile strain in the drain and source regions, thereby achieving a performance gain for N-channel transistors. In this scenario, however, the performance gain may be less than expected due to a variety of issues associated with the formation of a strained silicon carbon material. Further device scaling may involve further performance reducing mechanisms for countering short channel effects, such as increased dopant levels in the channel region, high-k dielectrics in the gate insulation layer and the like. It is, however, of high importance to provide efficient techniques for compensating or over-compensating for such mobility degrading approaches by efficiently increasing the charge carrier mobility for N-channel and P-channel transistors by providing additional efficient strain-inducing mechanisms, which may be used alone or in combination with the above-identified strategies. For example, stressed layers, such as a stressed contact etch stop layer, used for controlling the etch process for forming contact openings in an interlayer dielectric material enclosing the respective transistors, may be formed with a high amount of internal stress that may induce a corresponding strain in the channel regions.

Furthermore, in sophisticated semiconductor devices, isolation trenches are typically used for isolating individual transistors or groups of transistors, wherein silicon dioxide is usually used as an insulating fill material, which typically results in a compressively stressed trench configuration. Thus, the stressed isolation trench may also be used as a strain-inducing source for specific transistor configurations, in which the compressive stress of the isolation trenches is advantageous. However, the conventional process techniques for forming isolation trenches may not provide the required flexibility for addressing the different needs of P-channel transistors and N-channel transistors. Furthermore, the efficiency of the strain-inducing mechanism based on conventional STI techniques may be significantly less compared to other sources, such as stressed contact etch stop layers. Therefore, conventional STI techniques may not provide a significant performance gain, although, in principle, the trench isolations may represent appropriate device locations for endowing a desired type of biaxial strain in the adjacent active semiconductor regions.

The present disclosure is directed to various devices and methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique for forming isolation structures in such a way that strain is locally induced in accordance with device requirements in order to enhance the performance of respective transistor elements. In some aspects, isolation structures, such as trench isolations, may be formed on the basis of a highly stressed dielectric material, wherein the type and/or magnitude of intrinsic stress may be specifically adapted to correspondingly enhance performance of adjacent transistor elements. For example, an appropriately selected dielectric material for filling respective isolation trenches may be deposited to induce a desired type of strain in N-channel transistors, while the same or different material having an appropriate intrinsic stress may be formed in respective isolation trenches adjacent to P-channel transistors to correspondingly increase the hole mobility of these devices. Consequently, the performance of different transistor types may be individually enhanced, wherein the strain-inducing mechanism provided by the differently filled isolation trenches may in other aspects be advantageously combined with additional strain-inducing sources, such as strained semiconductor materials, stressed overlayers and the like.

In other aspects, a highly efficient strain-inducing mechanism may be provided by combining well-established trench fill techniques having a high fill capability with other deposition techniques, which may have the capability of providing a high intrinsic stress of the respective dielectric fill material. In this way, design specific characteristics of isolation trenches may be used in order to select an appropriate dielectric fill material. For instance, for narrow isolation trenches, a deposition technique may be used to provide the desired fill capabilities, while moderately wide trenches may be filled on the basis of techniques that may provide a high intrinsic stress of the respective fill material.

In still other aspects, two-dimensional strain characteristics may be taken into consideration in order to locally provide a desired type of biaxial strain in the respective channel regions of adjacent transistor elements by taking into consideration the strain-inducing effect of respective isolation trenches with respect to the transistor width direction and the transistor length direction. As a result, the subject matter disclosed herein provides a high degree of flexibility in providing additional strain-inducing sources while at the same time providing a high degree of compatibility with conventional process techniques for forming highly scaled circuit elements or with other process techniques for providing additional strain-inducing mechanisms.

According to one illustrative embodiment disclosed herein, a semiconductor device comprises a first active semiconductor region having at least one border formed by a first trench isolation structure including a first dielectric fill material. The semiconductor device further comprises a second active semiconductor region having at least one border formed by a second trench isolation structure including a second dielectric fill material other than the first dielectric fill material, wherein the second dielectric fill material has an intrinsic stress for inducing strain in the second active semiconductor region.

According to another illustrative embodiment disclosed herein, a method comprises forming a first isolation trench in a semiconductor layer and filling the first isolation trench with a first dielectric fill material having a first type of intrinsic stress. Furthermore, a second isolation trench is formed in the semiconductor layer and is filled with a second dielectric fill material that has a second type of intrinsic stress that differs from the first type of intrinsic stress.

According to yet another illustrative embodiment disclosed herein, a method comprises forming a first isolation trench having a first width in a semiconductor layer and filling the first isolation trench with a dielectric fill material on the basis of a first deposition technique with high gap fill capability. The method further comprises forming a second isolation trench in the semiconductor layer, wherein the second isolation trench has a second width greater than the first width. Finally, the second isolation trench is filled with a second dielectric fill material having a high intrinsic stress on the basis of a second deposition technique other than the first deposition technique.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein contemplates a technique for providing an efficient strain-inducing mechanism, which may be used alternatively or additionally to other strain-inducing mechanisms in order to enhance the performance of respective transistor elements, wherein a highly stressed dielectric fill material may be selectively provided in respective isolation trenches bordering respective active regions of a semiconductor device. Depending on the number of different types of fill material for the respective isolation trenches, the isolation structure may be formed on the basis of a respective number of manufacturing sequences in order to provide the desired type of fill material in the respective isolation trench, thereby obtaining an individual adapted performance enhancement in the isolation structures. The selection of a respective dielectric fill material for a certain isolation trench may be based on configuration-specific considerations of the respective isolation structures and/or may be based on the type of transistor element that is to be formed in the vicinity of the respective isolation trench. As is well known, for a standard crystallographic configuration of a silicon-based semiconductor material, i.e., a (100) surface orientation with respective transistor channels oriented with their length direction along a <110> direction, a tensile strain in the channel length direction and a tensile strain in the channel width direction may significantly enhance the electron mobility and thus may increase the drive current capability of the respective N-channel transistor. On the other hand, for this crystallographic configuration, a compressive strain along the channel length direction and a tensile strain along the channel width direction may significantly enhance the hole mobility of P-channel transistors. Consequently, a high tensile stress in the respective isolation trenches enclosing an N-channel transistor may significantly enhance the performance thereof, while only moderately negatively influencing the performance of a P-channel transistor, since a moderately high tensile strain component along the channel width direction may at least partially compensate for the per se undesired tensile component along the channel length direction of the P-channel transistor. However, for P-channel transistors, very efficient strain-inducing mechanisms are available which may overcompensate for a respective negative influence on the P-channel transistor.

For instance, it is well known that silicon nitride may be provided with high intrinsic stress on the basis of well-established plasma enhanced chemical vapor deposition (PECVD) processes, in which respective process parameters may be adjusted in order to obtain a high tensile or compressive stress upon depositing the silicon nitride material on a given surface. In such process techniques, the magnitude of compressive stress currently achievable by known techniques is typically significantly higher compared to the magnitude of tensile stress so that, by providing a respective stressed silicon nitride overlayer, such as a contact etch stop layer, respective sidewall spacers and the like, a highly efficient mechanism for P-channel transistors may be provided that may efficiently compensate for a corresponding adverse influence of a tensile isolation structure formed in the vicinity of the P-channel transistor. Furthermore, efficient techniques for inducing a desired type of strain in P-channel transistors may be provided in the form of a strained semiconductor material, such as silicon/germanium, which may provide a high performance gain compared to N-channel transistors, for which similarly efficient strain-inducing mechanisms may presently not be available. Consequently, isolation trenches that may be efficiently filled on the basis of deposition techniques providing a high degree of intrinsic stress may be provided in combination with isolation trenches requiring deposition techniques of high gap fill capabilities in order to maintain a high degree of compatibility with conventional process strategies, while nevertheless providing a significant performance gain for at least some of the corresponding transistor elements.

As explained above, the provision of a stressed fill material for moderately wide isolation trenches, which results in the generation of strain so as to enhance performance of N-channel transistors, may therefore enable a significant performance enhancement of N-channel transistors, thereby reducing the asymmetry in performance enhancement with respect to strain-inducing mechanisms for P-channel transistors and N-channel transistors presently available. Thus, highly efficient gap filling deposition techniques, such as chemical vapor deposition (CVD) processes on the basis of high density plasma ambients based on silicon dioxide may be used for isolation trenches having critical dimensions, while well-established PECVD techniques for silicon nitride may be used in combination with isolation trenches having less critical design dimensions in order to provide the highly stressed fill material therein. Furthermore, other design criteria for the isolation trenches may be used in order to select an appropriate dielectric fill material for obtaining the desired performance gain. For instance, isolation trenches extending along the transistor length and width directions may be provided with a different type of dielectric fill material so as to correspondingly adjust the resulting biaxial strain in the respective transistor.

In other cases, an appropriately stressed fill material may be provided in respective isolation trenches to position an appropriate stressed dielectric material in the vicinity of respective transistor elements in order to individually enhance the performance of N-channel transistors and P-channel transistors, wherein, additionally, if desired, the type of intrinsic stress of the respective fill materials may also be selected on the basis of the respective transistor orientation. For example, for the above-identified standard crystallographic configuration, a fill material may be provided for a P-channel transistor that induces a tensile strain along the channel width direction, while a respective stressed fill material may be provided in those isolation trenches which may substantially act along the transistor length direction. For other crystallographic configurations, for instance when the respective transistor length directions may be oriented along the <100> direction, the corresponding provision of stressed dielectric fill material may be adapted accordingly.

With reference to the accompanying drawings, further illustrative embodiments will now be described in which the isolation structure of a semiconductor device may be formed on the basis of two or more patterning stages to provide two or more different types of dielectric fill material for respective isolation trenches.

Figure 1A:
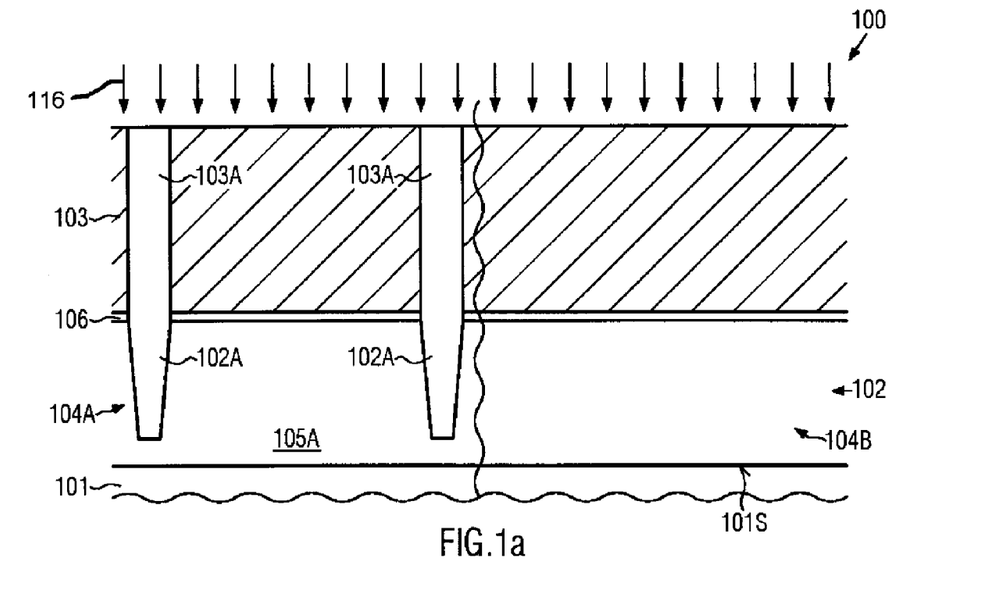
FIGS. 1a-1g schematically illustrate cross-sectional views of a semiconductor device comprising different active semiconductor regions for receiving respective transistor elements, wherein respective isolation structures are provided having a different type of intrinsic stress so as to individually induce a respective strain in the circuit elements of the active regions according to illustrative embodiments.

FIG. 1a schematically illustrates a cross sectional view of a semiconductor device 100 comprising a substrate 101 having formed thereabove a semiconductor layer 102. The substrate 101 may represent any appropriate carrier material for forming thereon the semiconductor layer 102. For example, the substrate 101 may represent a bulk semiconductor substrate, such as a silicon substrate, having formed thereon a silicon-based semiconductor material, that is, a semiconductor material including approximately 50 atomic percent silicon or more, wherein other species, such as germanium, carbon and the like, as well as certain dopant species, may be incorporated in the respective semiconductor layer 102. Furthermore, the substrate 101, including the semiconductor layer 102, may represent a silicon-on-insulator (SOI) configuration wherein a buried insulating layer (not shown) may be provided to electrically isolate the semiconductor layer 102 in the vertical direction. In this respect, it should be appreciated that any positional statements, such as "above," "below," "lateral," "vertical," "horizontal" and the like, are to be considered as relative positional information, wherein a surface 101S of the substrate 101 may be used as a "reference." In this sense, the semiconductor layer 102 is formed "above" the substrate 101. Similarly, the layer 102 may extend in the "horizontal" direction, i.e., the layer 102 is substantially parallel to the surface 101S.

The semiconductor device 100 may further comprise an etch mask 103 including respective openings 103A that substantially correspond to respective openings 102A formed in a first portion 104A of the semiconductor layer 102. The openings 102A may represent respective isolation trenches to be filled with an appropriate dielectric material to define a respective active region 105A within the portion 104A. The isolation trenches 102A may have to be filled with a first type of dielectric fill material in order to provide the desired strain characteristics in the active region 105A. In the embodiment shown in FIG. 1a, the etch mask 103 may thus be configured so as to completely cover a second portion 104B of the semiconductor layer 102 in which is to be formed a second active layer bordered by respective isolation trenches having different stress characteristics compared to the isolation trenches 102A. It should be appreciated that the etch mask 103 may comprise different material layers, such as an anti-reflective coating (ARC) layer and the like, as may be required for forming the mask 103. Furthermore, in one illustrative embodiment, a stop layer 106 may be provided in this manufacturing stage, which may be comprised of any appropriate material for controlling a subsequent chemical mechanical polishing (CMP) process for removing any excess material to be filled into the isolation trenches 102A in a subsequent process step. In other illustrative embodiments, the stop layer 106 may be formed in a later manufacturing stage so as to also cover respective exposed surface portions of the isolation trenches 102A.

A typical process flow for forming the semiconductor device 100 as shown in FIG. 1a may comprise the following processes. After providing the substrate 101 having formed thereon the semiconductor layer 102, the stop layer 106 may be formed, for instance by any appropriate oxidation and/or deposition technique, depending on the type of material used. For instance, in one illustrative embodiment, the isolation trenches 102A may be filled with a highly stressed dielectric material, such as silicon nitride, in which case the stop layer 106 may be formed of any appropriate material, such as silicon dioxide and the like, in order to allow reliable control of the subsequent CMP process. The silicon dioxide material may be formed by deposition or oxidation, depending on the process requirements. In other illustrative embodiments, other dielectric fill materials may be used for the isolation trenches 102A, such as highly stressed silicon dioxide and the like, and hence any other appropriate material such as silicon nitride may be used for the stop layer 106. As previously indicated, in other illustrative embodiments, the stop layer 106 may be omitted at this manufacturing stage and instead any other appropriate pad layers may be provided, or the semiconductor layer 102 may be directly patterned on the basis of the etch mask 103. Next, the etch mask 103 may be formed, for instance on the basis of photolithography techniques, wherein the respective lithography mask may be provided to locally cover the portion 104B, in which isolation trenches of different configuration and/or different fill material are to be formed. As previously indicated, the lithography process may be performed on the basis of a respective ARC layer (not shown) if required, while in other cases the etch mask 103 may be provided in the form of a hard mask, which may be patterned on the basis of a patterned resist layer, which may be removed after patterning of the respective hard mask layer. Next, an etch process 116 may be performed on the basis of any appropriate anisotropic etch recipe so as to transfer the openings 103A into the portion 104A, wherein respective etch parameters may be appropriately controlled in order to obtain the desired degree of tapering, etch depth and the like. As previously indicated, in some illustrative embodiments, the isolation trenches 102A may be etched to a depth that corresponds to the surface of a buried insulating layer (not shown) if an SOI configuration is considered. Next, the etch mask 103 may be removed and the further processing may be continued by filling the isolation trenches 102A.

Figure 1B:
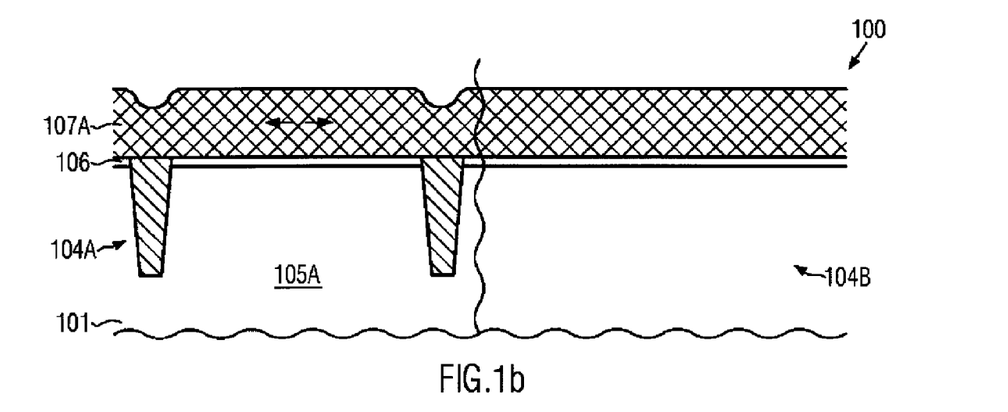

FIG. 1b schematically illustrates the semiconductor device 100 in a further advanced manufacturing stage. Here, a dielectric fill material 107A is provided, which, in one illustrative embodiment, may exhibit a high intrinsic stress, that is, the material 107A may be formed on underlying surfaces so as to have a high tendency for expanding or contracting, depending on the desired degree of intrinsic stress. For example, the dielectric fill material 107A may be provided with a high intrinsic stress so as to generate a respective strain in the active region 105A, which may enhance the performance of a respective transistor element to be formed in and on the active region 105A. The fill material 107A may be formed on the basis of any appropriate deposition technique that enables the creation of a desired type and magnitude of intrinsic stress. It should be appreciated that, in some illustrative embodiments, the isolation trenches 102A may have critical dimensions, i.e., a moderately narrow width that may require a deposition technique of high gap filling capabilities, as will be explained in more detail with reference to FIGS. 2a-2c. In the embodiment illustrated in FIG. 1b, it may be assumed that the fill material 107A may be provided with a moderately high intrinsic stress, for instance with a high tendency for expanding with respect to the underlying material, which will be referred to in the following as a tensile stress. For example, the dielectric fill material 107A may be comprised of silicon nitride having a high tensile stress, for instance of approximately 1 Giga Pascal (GPa) or significantly higher. As previously explained, silicon nitride may be deposited by PECVD techniques, wherein respective deposition parameters, such as ion bombardment during deposition, deposition temperature, deposition pressure, flow rate of carrier and reactive gases and the like, may be appropriately selected to create the respective stress. In particular, the degree of ion bombardment may represent an efficient process parameter for controlling the finally obtained type and magnitude of intrinsic stress. In other illustrative examples, the dielectric fill material 107A may be provided in the form of other materials such as silicon dioxide, which may be formed on the basis of deposition techniques, possibly in combination with oxidation processes, in order to obtain the desired degree of intrinsic stress.

It should further be appreciated that, prior to or after the deposition of the dielectric fill material 107A, additional process steps may be performed in order to adjust the characteristics of the isolation trenches 102A with respect to their electrical behavior. For instance, a certain degree of corner rounding may be desirable in some cases in order to appropriately reduce respective electrical fields at these corners, which may be accomplished on the basis of an oxidation process and the like. Furthermore, as previously indicated, the stop layer 106 may be formed after forming the isolation trenches 102A and prior to the deposition of the dielectric fill material 107A. In this case, the stop layer 106 may also cover inner surfaces of the isolation trenches 102A.

In further illustrative embodiments, the respective deposition process for forming the fill material 107A may be adjusted so as to exhibit a high degree of non-conformality. That is, the deposition rate at horizontal device portions, such as the bottom of the isolation trenches 102A, may be significantly higher compared to the deposition rate at substantially vertical device portions, such as the sidewalls of the isolation trenches 102A, thereby providing enhanced fill capabilities and also providing an increased amount of dielectric fill material within the isolation trenches 102A that has a substantially horizontal stress component, since the respective material is preferably deposited at the trench bottom, which may be considered as the "reference" surface of the corresponding intrinsic stress component.

Figure 1C:
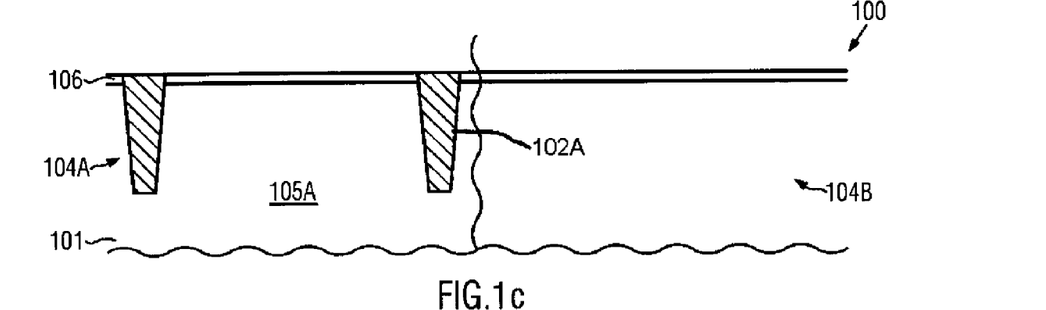

FIG. 1c schematically illustrates the semiconductor device 100 in a further advanced manufacturing stage. That is, excess material of the dielectric fill material 107A may be removed, for instance on the basis of a CMP process, wherein the stop layer 106 may be used for reliably controlling the respective removal process. For instance, the increasing exposure of the stop layer 106 during the CMP process may be reliably detected and may thus indicate an appropriate end point of the corresponding process. Any remaining residues of the material 107A may then be removed by a highly selective etch process, if required, when the stop layer 106 may have a higher removal rate during the CMP process compared to the material 107A. In other cases, when the stop layer 106 has a significantly reduced removal rate during the CMP process, the CMP process may be continued until substantially any unwanted portions of the fill material 107A may be removed from horizontal surface portions of the device 100. Thus, a substantially planar surface topography may be obtained, while the isolation trenches 102A are now filled with the fill material 107A, which may have a high intrinsic stress. For convenience, the filled isolation trenches are also indicated by the same reference numeral 102A.

Figure 1D:
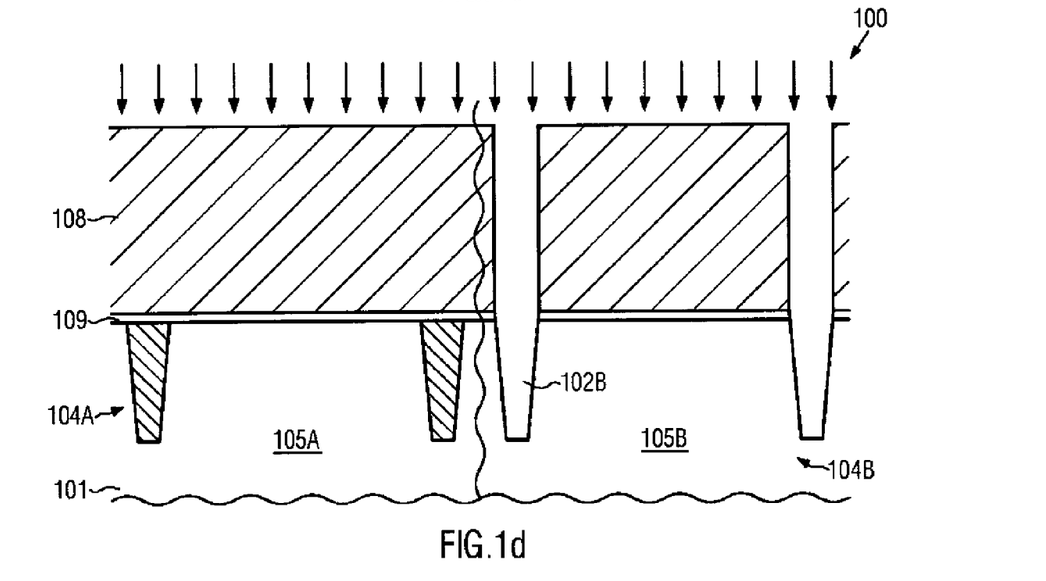

FIG. 1d schematically illustrates the semiconductor device 100 in a further advanced manufacturing stage. In this stage, a further etch mask 108 may be formed to cover the portion 104A while providing a respective pattern for forming respective isolation trenches 102B within the portion 104B. As previously explained with reference to the etch mask 103, the mask 108 may have any appropriate configuration, for instance the mask 108 may comprise ARC layers and/or may comprise hard mask materials and the like, as required by the respective process strategy. Furthermore, a stop layer 109 may be formed above the semiconductor layer 102 wherein the stop layer 109 may substantially correspond to the stop layer 106 if the preceding manufacturing sequence may not have unduly damaged the layer 106, while, in other illustrative embodiments, the stop layer 106 may have been removed and the layer 109 may be formed from any appropriate material so as to meet the stop requirements with respect to a dielectric fill material to be filled into respective isolation trenches 102B. For example, the stop layer 109 may be comprised of silicon dioxide, silicon nitride or any other appropriate material. Similarly, the stop layer 109 may be formed at a later stage, as is also described with reference to the stop layer 106.

With respect to a process sequence for forming the isolation trenches 102B on the basis of the etch mask 108, the same criteria apply as previously explained with reference to the etch process 116.

Figure 1E:
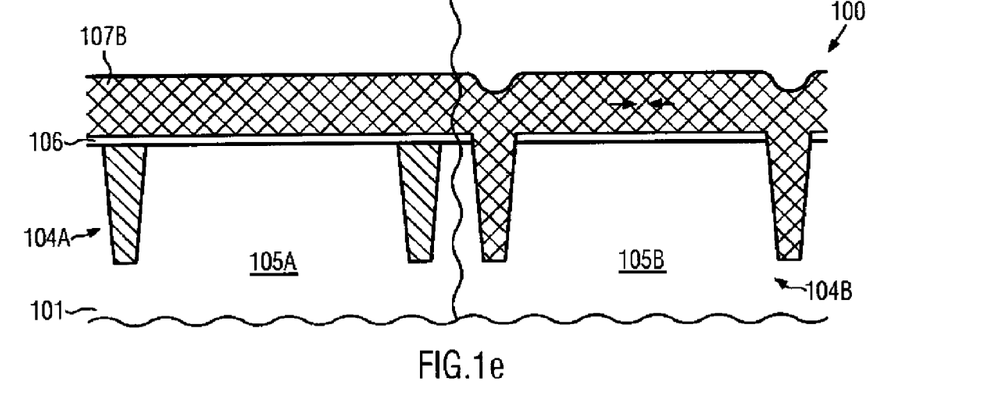

FIG. 1e schematically illustrates the semiconductor device 100 with a dielectric fill material 107B for filling the respective isolation trenches 102B. In the embodiment shown, the dielectric fill material 107B may be provided as a fill material having a different type of intrinsic stress, for instance the material 107B may have the tendency of contracting with respect to the underlying deposition surfaces, which may be referred to hereinafter as a compressive stress. As previously explained, silicon nitride may be deposited with a high degree of compressive stress, wherein the magnitude may range from 1.5-2 GPa and even higher. In other illustrative embodiments, the material 107B may represent a silicon dioxide material having a high degree of compressive stress. In some illustrative embodiments, the dielectric fill material 107B may not only differ in the type of intrinsic stress but may also differ in material composition with respect to the dielectric fill material 107A. Furthermore, the material 107B may be formed on the basis of any appropriate deposition technique, for instance PECVD, high density plasma CVD and the like, depending on the type of material and intrinsic stress required. Furthermore, in some illustrative embodiments, the dielectric fill material 107B may be deposited in a highly non-conformal manner, i.e., the vertical deposition rate may be significantly less compared to the horizontal deposition rate, thereby providing a high degree of "horizontal" stress.

Figure 1F:
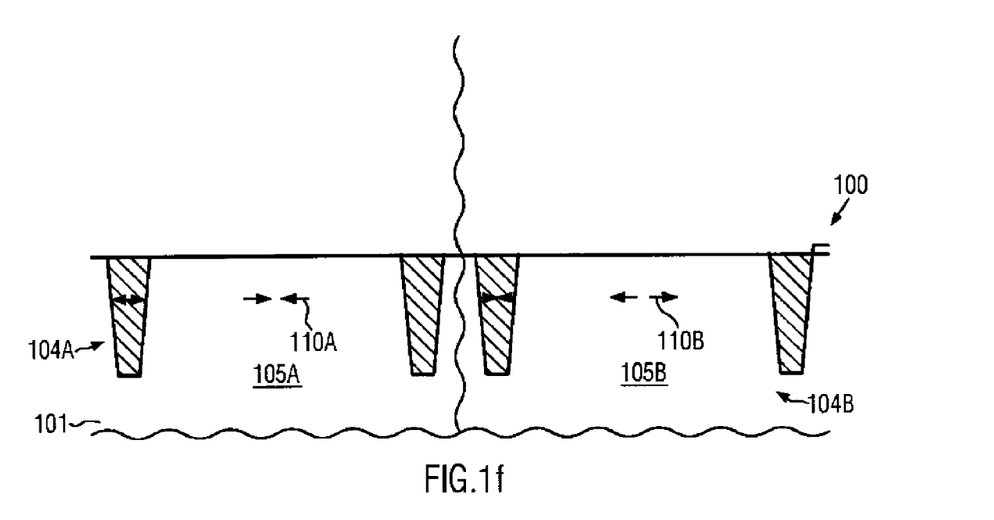

FIG. 1f schematically illustrates the semiconductor device 100 after the removal of excess material of the material 107B, which may be accomplished on the basis of CMP and/or etching using the stop layer 109 for reliably controlling the respective removal process, as is previously explained with reference to the stop layer 106. Thereafter, the remaining portion of the stop layer 109 may be removed on the basis of well-established selective etch processes. Consequently, a respective strain 110A may be induced within the active region 105A defined by the isolation trenches 102A, while a respective different type of strain 110B may be induced in the active region 105B due to the respective isolation trenches 102B. For example, for the above-identified definition of the intrinsic stresses in the isolation trenches 102A, 102B, the corresponding induced strain 110A may be indicated as a compressive strain, which may, for a standard silicon crystallographic configuration, result in a corresponding performance enhancement of a P-channel transistor. That is, the horizontal direction in FIG. 1f may represent the channel length direction so that the corresponding "compressive" strain 110A may act along the channel length direction, thereby increasing the hole mobility within the active region 105A. Similarly, the strain 110B may be denoted as a tensile strain, which may result in a significant mobility enhancement for electrons. It should be appreciated, however, that other strain "configurations" may be used when the crystallographic configuration of the semiconductor layer 102 may differ from the standard configuration.

Figure 1G:
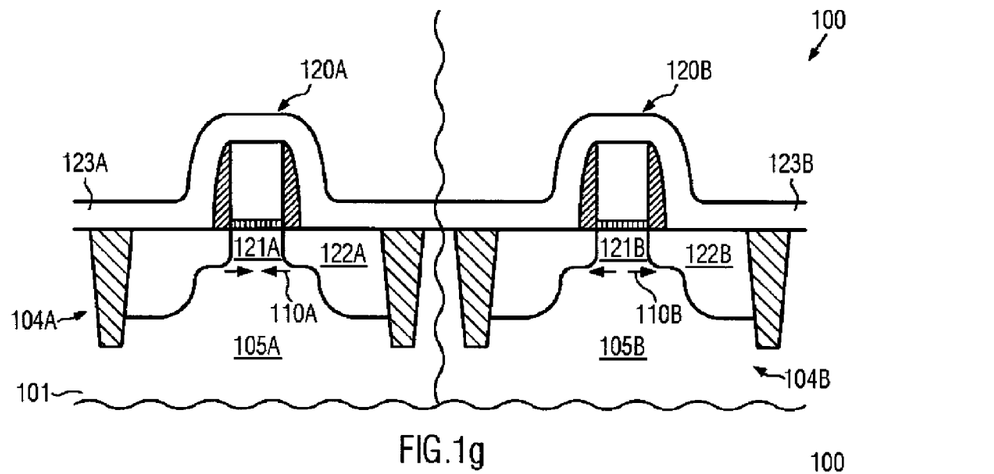

FIG. 1g schematically illustrates the semiconductor device 100 in a further advanced manufacturing stage. Here, respective transistor elements 120A, 120B are formed in and on the respective active regions 105A, 105B. The transistor 120A thus comprises a channel region 121A that has substantially the strain 110A in order to appropriately enhance the charge carrier mobility in the channel region 121A. Similarly, the transistor 120B comprises the channel region 121B having the strain 110B for respectively enhancing corresponding charge carrier mobility therein. Consequently, the drive current capability of the transistors 120A, 120B may be individually adjusted by providing different types of stressed dielectric fill material in the respective isolation trenches 102A, 102B. It should be appreciated that the strain-inducing mechanism provided by the stress isolation trenches 102A, 102B in the transistor 120A and/or the transistor 120B may be complemented with additional strain-inducing mechanisms, for instance using an embedded strain semiconductor material, such as silicon/germanium, silicon/carbon, which may be provided in respective drain and source regions 122A, 122B based on device requirements. Additionally or alternatively, a corresponding stressed overlayer may be provided in one or both of the transistors 120A, 120B, as is shown in the form of respective contact etch stop layers 123A, 123B, which may additionally be used as etch stop layers during the formation of respective contact openings in a dielectric material to be provided for embedding the transistors 120A, 120B.

Figure 1H:
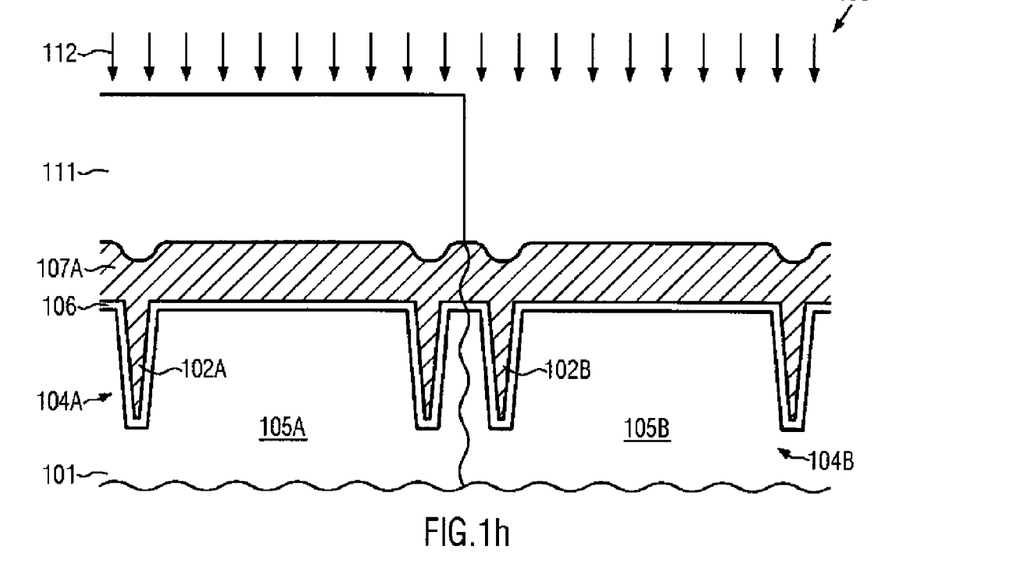
FIGS. 1h-1i schematically illustrate cross-sectional views of the semiconductor device according to further illustrative embodiments, in which a trench patterning process is commonly performed for the different active regions.

With reference to FIG. 1h, a further illustrative embodiment will now be described, in which the process of patterning respective isolation trenches may be accomplished on the basis of a common etch process, while the provision of respective dielectric fill materials may be based on an additional patterning process so as to provide different types of fill material for the respective isolation trenches.

In FIG. 1h, the semiconductor device 100 comprises the respective isolation trench 102A, 102B filled with the dielectric material 107A, wherein the stop layer 106 may also be formed within the respective trenches 102A, 102B so as to also act as an etch stop layer during the subsequent manufacturing processes. The material 107A may be provided as a highly stressed fill material in order to provide the enhanced strain characteristics within the active region 105A, as is previously explained. Furthermore, an etch mask 111 may be provided to cover a portion of the semiconductor device 100 corresponding to the portion 104A of the semiconductor layer 102 while exposing the portion corresponding to the semiconductor portion 104B.

The semiconductor device 100 as shown in FIG. 1h may be formed according to the following processes. After providing the substrate 101 having formed thereon the semiconductor layer 102, a respective patterning process may be performed which may be based on conventional lithography masks in order to commonly define the isolation trenches 102A, 102B by any appropriate patterning process. Thereafter, the stop layer 106 may be formed by any appropriate deposition or oxidation process, depending on the type of material used. For instance, the stop layer 106 may be formed from silicon dioxide when the material 107A is substantially comprised of silicon nitride. Next, the fill material 107A may be deposited on the basis of any appropriate deposition technique in order to provide the desired type of intrinsic stress. Thereafter, the mask 111 may be formed, for instance by photolithography, wherein conventional lithography masks may be used as are also used for defining P-well regions and N-well regions, when a corresponding distinction of stressed materials according to P-well regions and N-well regions is desired. In other illustrative examples, the mask 111 may be formed so as to expose any desired device portions, in which the respective isolation trenches 102B may receive a different type of dielectric fill material. Next, a selective etch process 112 may be performed in order to remove the exposed portion of the material 107A, wherein the stop layer 106 may act as an efficient etch stop layer. Thereafter, the etch mask 111 may be removed and an appropriate second dielectric fill material, such as the fill material 107B, may be deposited on the basis of any appropriate technique in order to provide the desired type of stress within the isolation trenches 102B as is previously explained. Thereafter, any excess material of the second type of material and the material 107A may be removed by CMP and/or etching as is previously explained. Consequently, in this process regime, differently stressed dielectric fill materials may also be provided in a highly local manner for the respective isolation trenches 102A, 102B. Thereafter, the further processing may be continued as is previously described with reference to FIG. 1g.

Figure 1I:
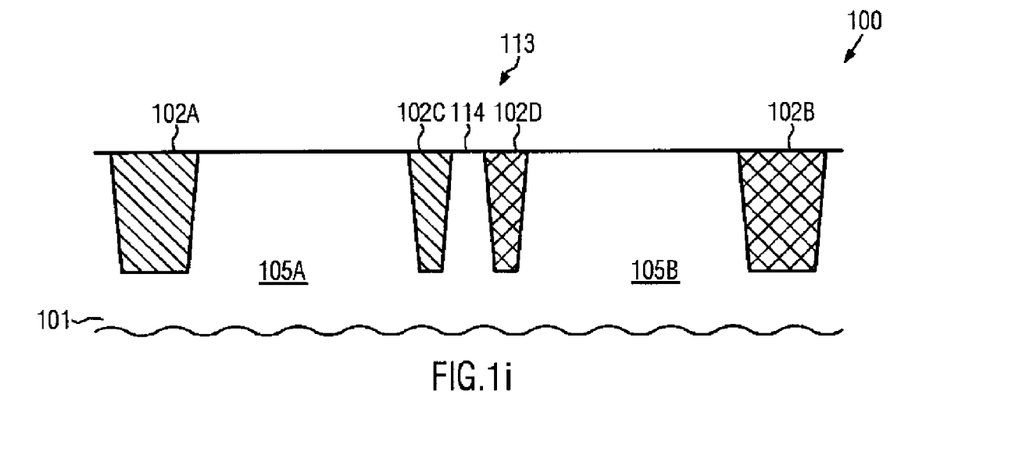

With reference to FIG. 1i, a further illustrative embodiment will now be described in which adjacent active regions for transistors of different conductivity types are formed such that, even at a common border between the adjacent active regions, different types of stressed isolation trenches are provided.

In FIG. 1i, the semiconductor device 100 includes the active regions 105A, 105B in the form of adjacent regions, i.e., the regions 105A, 105B are to be considered as neighboring active regions without any active region provided therebetween. To this end, the active region 105A may have the isolation trenches 102A at its periphery while the active region 105B may have the isolation trenches 102B at its periphery, as is previously described. Furthermore, at an inner border indicated as 113, which may be considered as an "intra well" isolation structure, respective isolation trenches 102C, 102D may be provided which are filled with a dielectric fill material having an intrinsic stress corresponding to the isolation trenches 102A and 102B, respectively. A corresponding arrangement of wide and narrow intra well and inner well trenches will be described with reference to FIGS. 2a-2c below. Furthermore, a corresponding "inactive" region 114 may be formed between the isolation trenches 102C, 102D, wherein the inactive region 114 may represent a portion of the semiconductor layer 102 or may be provided in the form of any other appropriate material, depending on the process strategy. As previously described, the trenches 102A, 102C may be formed and filled in a common process and similarly the trenches 102D, 102B may be formed and filled in a common process. Alternatively, the trenches 102A, 102B, 102C, 102D may be formed in a common etch process and the filling may be accomplished according to a process sequence as is described above with reference to FIG. 1h. Consequently, even for adjacent transistor elements of different conductivity type, an individual performance gain may be obtained by providing the correspondingly stressed isolation trenches 102A, 102C and 102B, 102D, respectively.

Figure 1J:
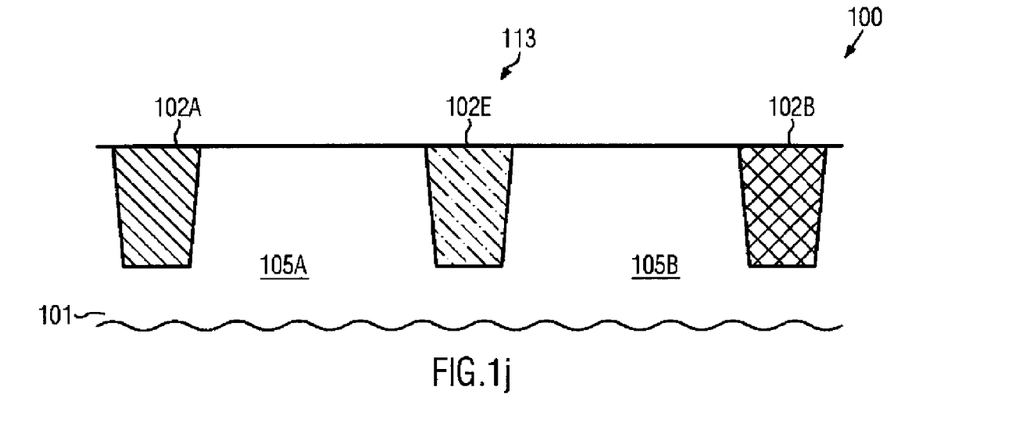
FIG. 1j schematically illustrates a cross-sectional view of a semiconductor device, in which three different types of fill material may be used so as to individually adjust the respective strain in the active regions of the semiconductor device according to further illustrative embodiments.

FIG. 1j schematically illustrates the semiconductor device 100 according to a further illustrative embodiment which is similar to the embodiment of FIG. 1i, wherein, however, a third type of dielectric fill material may be provided for one or more isolation trenches in the device 100. In the embodiment shown in FIG. 1j, the respective isolation trenches 102A, 102B may be provided as is previously described in any of the preceding embodiments, while, additionally, a further type of isolation trench, indicated as 102E, may be provided, which may be filled with a different type of dielectric fill material. In one illustrative embodiment, the respective active regions 105A, 105B may represent adjacent active regions with an inner border represented by the isolation trench 102E. Since the active regions 105A, 105B may require a different type of intrinsic stress in the isolation trenches 102A, 102B, the trench 102E may be provided with a more "neutral" dielectric fill material in order to not unduly negatively affect both the active region 105A and the active region 105B. For example, the isolation trench 102E may be filled with an appropriate dielectric material of low intrinsic stress, such as silicon dioxide, silicon nitride and the like, while trenches 102A, 102B may have formed therein a highly stressed dielectric material, such as silicon nitride, silicon dioxide and the like. For this purpose, an additional lithography step may be introduced so as to individually pattern the isolation trench 102E, as is for instance described with reference to FIGS. 1a-1g for the isolation trenches 102A, 102B. In other cases, the additional lithography step may be used for selectively removing any unwanted fill material from the trench 102E in order to finally provide the desired type of fill material, as is for instance described with reference to FIG. 1h. Consequently, highly efficient strain-inducing mechanisms may be provided for transistor elements formed on a common well region, while different types of well regions may receive differently stressed isolation trenches. On the other hand, adjacent active semiconductor regions requiring different types of strain may be separated by the isolation trench 102E having a third type of dielectric fill material for appropriately buffering any unwanted mutual influence on the adjacent semiconductor regions.

With reference to FIGS. 2a-2d, further illustrative embodiments will now be described, in which, additionally or alternatively, the type of conductivity design differences of the isolation trenches, as well as the orientation thereof, may be taken into consideration when selecting a specific type of stressed fill material for respective isolation trenches. As previously explained, efficient deposition techniques having a high gap filling capability may be available in conventional process techniques wherein, however, a respective intrinsic stress of the dielectric fill material may not be efficiently implemented. For instance, in conventionally used high density plasma deposition processes for silicon dioxide, even narrow isolation trenches may be reliably filled wherein, however, the resulting stress may not be appropriate for providing the desired performance enhancement.

Additionally or alternatively, the respective orientation of isolation trenches with respect to a transistor width direction and a transistor length direction may be taken into consideration when selecting an appropriate stressed dielectric fill material for respective isolation trenches. For example, for standard crystallographic configurations, i.e., a (100) surface orientation and a transistor length direction oriented along the <110> direction, the performance of a P-channel transistor may be significantly enhanced by providing differently stressed isolation trenches in the transistor length direction and the transistor width direction.

Figure 2A:
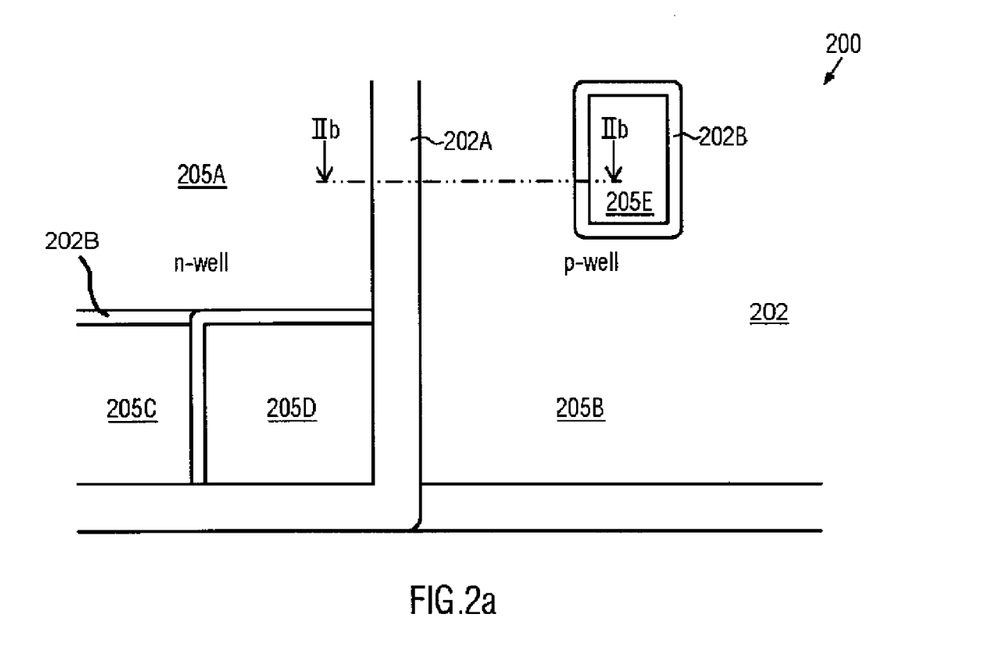
FIG. 2a schematically illustrates a top view of a semiconductor device including differently sized isolation trenches, wherein the dielectric fill material may be selected in accordance with the respective trench dimensions according to further illustrative embodiments.

FIG. 2a schematically illustrates a top view of a semiconductor device 200 comprising a semiconductor layer 202, such as a silicon-based layer and the like. The semiconductor layer 202 may comprise a plurality of active semiconductor regions 205A, 205B, 205C, 205D, 205E, which may be bordered by respective trench isolation structures 202A, 202B. For example, the active region 205A may represent an N-well region in which a plurality of further active regions, such as the regions 205C, 205D may be defined on the basis of the respective isolation trench 202B, which may be considered as an inner well isolation trench. Similarly, the active region 205B may represent, for instance, a P-well, which may also include one or more smaller active regions, such as the region 205E, which may be bordered by a respective inner well isolation trench 202B. In the embodiment shown, the isolation trenches 202B may have a trench width that is less compared to a trench width of the isolation trench 202A, which, in the embodiment illustrated, may act as an intra well border between the active regions 205A and 205B. It should be appreciated, however, that corresponding inner well isolation trenches may also have increased width dimensions comparable to the isolation trench 202A.

As previously explained, respective N-channel transistors may have to be formed within the active region 205B, wherein a high tensile strain in the active region 205B may significantly enhance the performance of the respective transistors formed therein. Thus, the respective isolation trench 202A may be filled with an appropriately stressed dielectric fill material so as to obtain the desired type of strain in the active region 205B. As previously explained, well-established deposition techniques are available for forming silicon nitride with high intrinsic stress, wherein, however, presently established PECVD techniques may suffer from a reduced gap filling capability compared to well-established high density plasma oxide deposition processes. Consequently, the moderately narrow isolation trenches 202B may be formed on the basis of a deposition technique providing a high gap fill capability, while the isolation trench 202A may be formed on the basis of PECVD processes in order to provide a high intrinsic stress for the corresponding dielectric fill material.

Figure 2B:
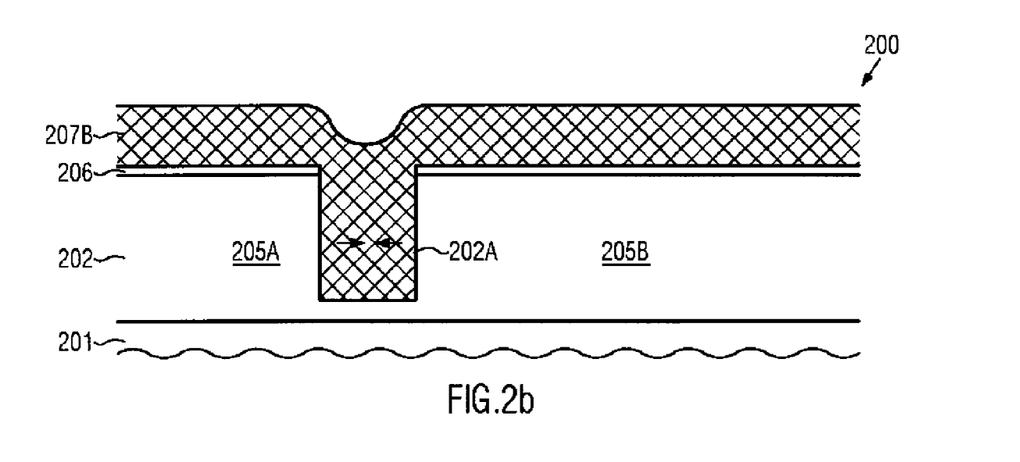
FIGS. 2b-2c schematically illustrate cross-sectional views along the line IIb-IIb of FIG. 2a during various manufacturing stages according to further illustrative embodiments.

FIG. 2b schematically illustrates a cross-sectional view of the semiconductor device 200 according to the line IIb-IIb of FIG. 2a in an early manufacturing stage, in which the corresponding isolation trenches 202B are still to be formed. In this manufacturing stage, the device 200 comprises the semiconductor layer 202 formed above a substrate 201, which may represent any appropriate carrier material, as is also described with reference to the substrate 101. Moreover, the isolation trench 202A is formed within the semiconductor layer 202 so as to separate the active regions 205A and 205B. Furthermore, in this manufacturing stage, a stressed dielectric fill material 207B may be formed above the semiconductor layer 202 so as to substantially completely fill the isolation trench 202A. A stop layer 206 may be formed at least at horizontal surface portions of the semiconductor layer 202, while, in some illustrative embodiments, the stop layer 206 may also be formed within the isolation trench 202A. In one illustrative embodiment, the stressed dielectric fill material 207B may be comprised of silicon nitride, while the stop layer 206 may be comprised of silicon dioxide.

A typical process for forming the semiconductor device 200 as shown in FIG. 2b may comprise similar process techniques as previously described with respect to the device 100. That is, the isolation trench 202A may be patterned on the basis of an appropriate lithography process followed by an appropriate deposition process, such as a PECVD process with appropriate process parameters so as to obtain the desired type of intrinsic stress. In the embodiment shown in FIGS. 2a and 2b, the intrinsic stress of the fill material 207B may be selected so as to induce a respective tensile strain in the active region 205B, thereby enhancing the performance of N-channel transistors as is previously explained. Thereafter, any excess material of the layer 207B may be removed, for instance on the basis of CMP, wherein the stop layer 206 may be used for reliably controlling the respective removal process. Thereafter, a further patterning sequence may be performed on the basis of an appropriately selected lithography mask in order to define the respective isolation trenches 202B having the reduced dimensions. Next, the corresponding isolation trenches 202B may be filled with an appropriate dielectric fill material, such as silicon dioxide formed on the basis of a deposition technique having a high gap filling capability, such as CVD on the basis of a high density plasma, a sub-atmospheric CVD process on the basis of TEOS and the like. Thereafter, any excess material may be removed on the basis of a respective stop layer, as is also previously explained with reference to the device 100.

Figure 2C:
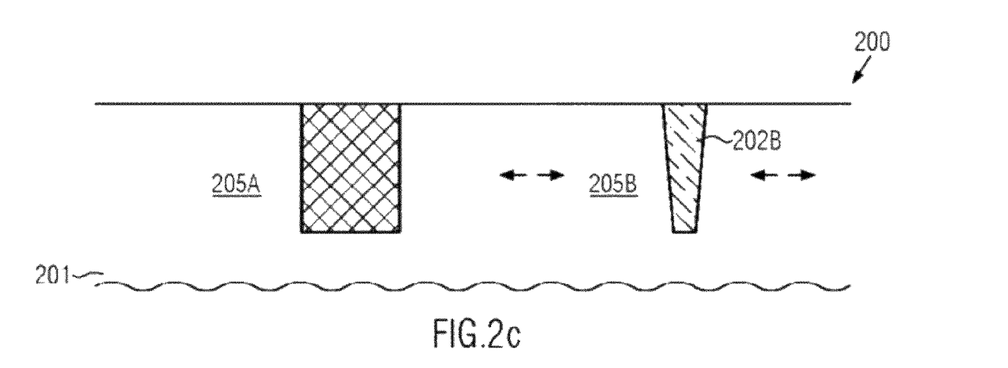

FIG. 2c schematically illustrates the semiconductor device 200 after the above-described process sequence. Hence, the device 200 comprises the isolation trench 202B filled with an appropriate fill material, such as silicon dioxide, substantially without any voids, while the highly stressed material in the isolation trench 202A provides the desired type of strain within the active region 205B. In the embodiment shown, the active region 205B may represent a P-well region wherein a respective tensile strain may result in an increased electron mobility for any N-channel transistors to be formed in and above the active region 205B. As previously explained, any negative impact of the stress in the isolation trench 202A with respect to the adjacent active region 205A may be less critical, since highly efficient strain-inducing mechanisms are available for P-channel transistors, thereby effectively overcompensating for any negative influence.

Furthermore, it should be appreciated that the above-described process sequence may also be performed in a different order, wherein the isolation trenches 202B may be formed first and subsequently the highly stressed isolation trenches 205A may be manufactured. In other illustrative embodiments, the trenches 202A, 202B may be patterned on the basis of a common lithography mask and a common etch process, similar to conventional process strategies, and thereafter the filling in of the respective dielectric fill materials may be based on an additional lithography step for selectively removing unwanted dielectric fill material from one of the isolation trenches, as is also described with reference to FIG. 1h.

Figure 2D:
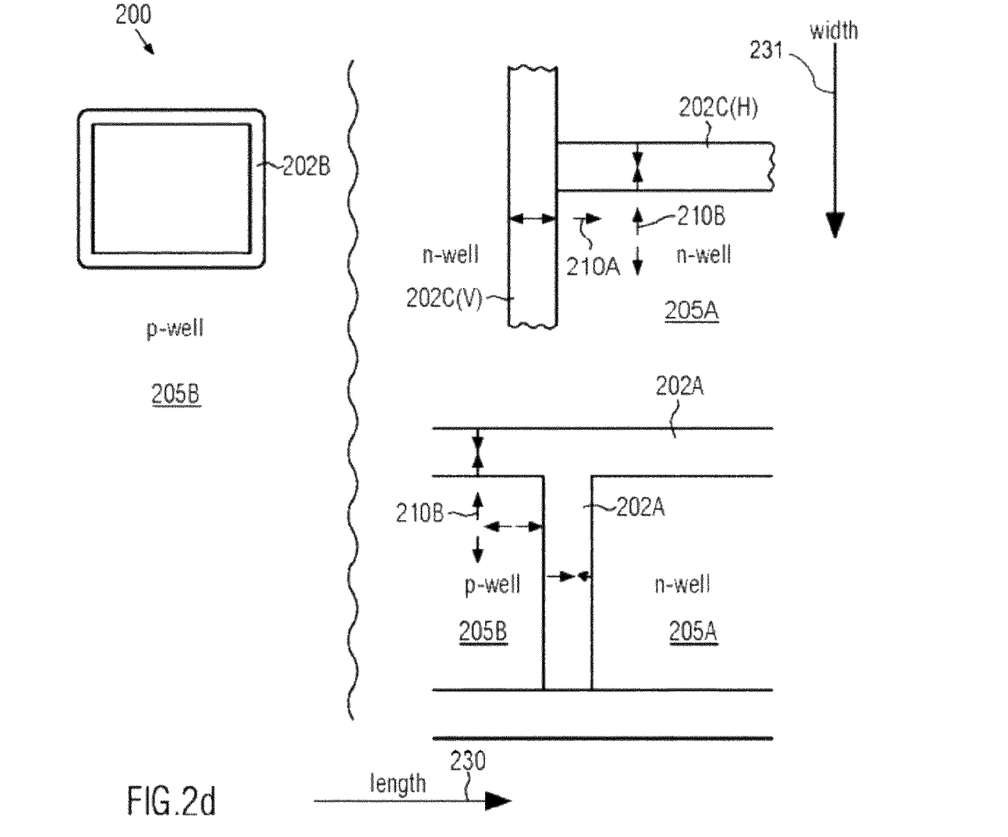
FIG. 2d schematically illustrates a top view of a semiconductor device including a plurality of different types of intra well and inner well isolation trenches in order to provide an enhanced biaxial strain in respective active regions of the semiconductor device according to still further illustrative embodiments.

FIG. 2d schematically illustrates a top view of the device 200 according to further illustrative embodiments. The device 200 may comprise a plurality of active semiconductor regions 205A, which may represent N-well regions for forming therein respective P-channel transistors. Similarly, a plurality of active regions 205B may be provided, which may represent P-well regions for forming therein respective N-channel transistors. The various active semiconductor regions 205A, 205B may be bordered by respective isolation trenches 202A, 202B, 202C wherein, for instance, isolation trenches having a reduced width may be indicated as trenches 202B, while trenches of increased width compared to the trenches 202B may be indicated as trenches 202A and 202C. Both types of trenches, i.e., trenches having a reduced width and a higher width may be used as inner well or intra well borders, depending on the device configuration. For example, the isolation trenches 202A may be considered as wide intra well trenches, while the isolation trenches 202C may be considered as wide inner well trenches. In one illustrative embodiment, the narrow isolation trenches 202B may be filled with an appropriate material that may be deposited on the basis of a deposition technique providing a high gap filling capability, as is previously explained. On the other hand, the wide isolation trenches 202A, 202C may comprise a highly stressed dielectric fill material, wherein, in one illustrative embodiment, the relative orientation of the respective isolation trenches 202A, 202C with respect to a transistor length direction 230 and a transistor width direction 231 is also taken into consideration. That is, in the example shown, the isolation trenches 202C, one of which is indicated as (H) while the other is indicated as (V), may be filled with a material of different intrinsic stress. For example, the regions 205A may represent N-well regions for forming thereon and therein P-channel transistors, which may require a different type of strain with respect to the directions 230 and 231. For instance, for a standard configuration wherein the length direction 230 is substantially oriented along the <110> crystalline direction, a compressive strain may significantly enhance the hole mobility while a corresponding tensile strain along the width direction 231 may also contribute to an increased hole mobility. Consequently, the isolation trench 202C(V) may be comprised of a dielectric fill material producing a required compressive strain along the direction 230, while the isolation trench 202C (H) may comprise a dielectric fill material having a different type of intrinsic stress resulting in a corresponding tensile strain component along the direction 231.

On the other hand, in this device configuration, the respective isolation trenches 202A may comprise a dielectric fill material producing a respective tensile strain 210B along the length direction 230 and along the width direction 231. As previously explained, any negative impact of the horizontal and vertical isolation trenches 202A having the tensile strain-inducing dielectric fill material may be accepted, since other strain-inducing mechanisms for P-channel transistors are available. For example, if the N-well 205A may comprise one or more inner well isolation trenches, such as the trenches 202C, a respective configuration may be selected for horizontal and vertical isolation trench components as described above, in order to significantly enhance the performance of P-channel transistors enclosed by the respective isolation trenches 202C. In other cases, additional strain-inducing sources for P-channel transistors, such as highly stressed overlayers, strained semiconductor materials and the like, may be used.

It should be appreciated that a corresponding regime for providing different types of intrinsic stresses for isolation trenches oriented along the length direction 230 and the width direction 231 may also be applied to the narrow width trenches 202B, if appropriate deposition techniques may be available for reliably filling the corresponding trenches while nevertheless providing a substantially void-free fill behavior.

The semiconductor device 200 as shown in FIG. 2d may be formed in accordance with process techniques as previously described with reference to the device 100 and with reference to FIGS. 2a-2c. However, an additional lithography step may be introduced in order to provide the possibility to distinguish between isolation trenches of different orientation. In one illustrative embodiment, the intra well isolation trenches 202A having a high width may be formed on the basis of a highly stressed fill material inducing the respective tensile strain 210B in respective active regions, such as regions 205B, and in the same process sequence, the inner well isolation trenches 202C(H) may also be formed to provide the respective strain component 210B, while the inner well isolation trenches 202C(V) may be formed in a separate process sequence using a highly stressed dielectric fill material of a different type of stress in order to provide the desired compressive strain component 210A. Furthermore, in a further different process sequence, the narrow width isolation trenches 202B may be formed on the basis of a deposition technique providing the required gap filling capabilities. It should be appreciated that the different process sequences for forming the different types of isolation trenches 202A, 202B and 202C may be based on process sequences including respective lithography, etch and removal processes for each type of isolation trench, while, in other cases, one or more of the isolation trenches may be formed in a common lithography and etch process, while the corresponding filling in of the stressed dielectric fill materials may be based on different lithography masks, as is previously described. It should further be appreciated that the type of stressed fill material of the respective isolation trenches 202A, 202B and 202C may be selected on the basis of the given crystalline configuration of the semiconductor layer 202 in order to take into consideration the corresponding crystallographic characteristics of the charge carrier mobility in the various crystallographic directions. Similarly, if an increased performance of P-channel transistors may be desired, the isolation trenches 202A may be formed so as to provide a high compressive strain in the respective length direction 230, while respective isolation trenches 202A substantially responsible for the strain component in the width direction may be provided so as to induce a corresponding tensile strain component.

As a result, the subject matter disclosed herein provides a technique for forming isolation trenches, which may include a different degree of intrinsic stress so as to enhance the performance of at least one type of transistor elements, such as N-channel transistors. Furthermore, the subject matter disclosed herein provides the potential for individually adapting the isolation trenches bordering respective active semiconductor regions by providing different types of intrinsic stress in order to induce a desired type of strain in different active semiconductor regions. For this purpose, the patterning process or the process for filling in a corresponding dielectric fill material may be performed in a locally different manner in order to obtain the isolation trenches of different intrinsic stress. The corresponding sequence of locally forming the respective isolation trenches may be performed for more than two different types of isolation trenches, thereby providing a high degree of flexibility in individually adapting the strain characteristics of respective active semiconductor regions. Consequently, a high degree of compatibility with conventional techniques may be achieved since well-established patterning and deposition techniques may be used. Furthermore, the subject matter disclosed herein is highly compatible with other strain-inducing mechanisms implemented at a later stage of the manufacturing flow.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
a first active semiconductor region having at least one border formed by a first trench isolation structure including a first dielectric fill material having a first type of intrinsic stress, wherein said first trench isolation structure has a first trench width and said first type of intrinsic stress is one of a tensile type stress and a compressive type stress;
a second active semiconductor region having at least one border formed by a second trench isolation structure including a second dielectric fill material, said second dielectric fill material having a second type of intrinsic stress, wherein said second trench isolation structure has a second trench width, said first width is less than said second trench width, and said second type of intrinsic stress is of an opposite type from said first type of intrinsic stress; and
a third trench isolation structure having a third trench width that is greater than said first trench width, said third isolation structure comprising a third dielectric fill material having a third type of intrinsic stress.

2. The semiconductor device of claim 1, further comprising a first transistor formed in said first active semiconductor region and a second transistor formed in said second active semiconductor region, said first and second transistors differing in at least one of conductivity type and transistor configuration.

3. The semiconductor device of claim 1, wherein said first and second isolation trenches are oriented substantially perpendicular to each other.

4. The semiconductor device of claim 1, wherein said third type of intrinsic stress is of a same type as and of a lesser magnitude than said first type of intrinsic stress.

5. The semiconductor device of claim 1, wherein said third type of intrinsic stress is of a same type as and of a lesser magnitude than said second type of intrinsic stress.

6. The semiconductor device of claim 1, wherein a magnitude of said first type of intrinsic stress is at least approximately 1 Giga Pascal.

7. The semiconductor device of claim 1, wherein a magnitude of said second type of intrinsic stress is at least approximately 1 Giga Pascal.

8. The semiconductor device of claim 1, wherein at least one of said first and second dielectric fill materials comprises silicon nitride.

9. The semiconductor device of claim 8, wherein said first dielectric fill material comprises silicon dioxide.

10. The semiconductor device of claim 1, wherein said third isolation structure is formed adjacent to both said first active semiconductor region and said second active semiconductor region, and wherein said third type of intrinsic stress is of a magnitude which is less than said first and second types of intrinsic stresses.

11. The semiconductor device of claim 10, wherein said first and second dielectric fill materials comprise silicon nitride and said third dielectric fill material comprises silicon dioxide.

12. The semiconductor device of claim 1, wherein said third trench isolation structure forms at least one additional border of said second active semiconductor region, and wherein said third trench isolation structure is oriented substantially perpendicular to said at least one border formed by said second trench isolation structure.

13. The semiconductor device of claim 12, wherein said third type of intrinsic stress is of a same type as said second type of intrinsic stress.

14. The semiconductor device of claim 12, wherein said third type of intrinsic stress is of an opposite type from said second type of intrinsic stress.

\* \* \* \* \*